(12) United States Patent
Erretby et al.

(10) Patent No.: US 9,138,776 B2
(45) Date of Patent: Sep. 22, 2015

(54) PROCESS FOR APPLYING COATINGS WITH METALLIC CHROMIUM

(75) Inventors: Maria Benelmekki Erretby, Barcelona (ES); Montse Riera Giner, Barcelona (ES)

(73) Assignee: SIDASA ENGINEERING, S.L., Barcelona (ES)

( * ) Notice: Subject to any disclaimer, the term of this patent is extended or adjusted under 35 U.S.C. 154(b) by 1064 days.

(21) Appl. No.: 11/448,400

(22) Filed: Jun. 7, 2006

(65) Prior Publication Data

US 2007/0020396 A1 Jan. 25, 2007

Related U.S. Application Data

(60) Provisional application No. 60/700,551, filed on Jul. 19, 2005.

(51) Int. Cl.

| | |
|---|---|
| *C23C 16/00* | (2006.01) |
| *B05D 5/06* | (2006.01) |
| *C23C 14/02* | (2006.01) |
| *C23C 14/20* | (2006.01) |
| *B01J 19/08* | (2006.01) |
| *G21H 1/00* | (2006.01) |
| *G21H 5/00* | (2006.01) |
| *H01F 41/00* | (2006.01) |
| *C08F 2/46* | (2006.01) |
| *C08J 7/18* | (2006.01) |
| *B05D 5/02* | (2006.01) |

(52) U.S. Cl.
CPC ............... *B05D 5/061* (2013.01); *B05D 5/067* (2013.01); *C23C 14/024* (2013.10); *C23C 14/20* (2013.01); *B05D 5/02* (2013.01); *B05D 5/068* (2013.01)

(58) Field of Classification Search
CPC ........ C23C 14/02; C23C 14/14; C23C 14/06; C23C 14/024; C23C 14/20; C23C 28/00; B05D 5/061; B05D 5/067; B05D 5/02; B05D 5/068
USPC .................. 427/248.1, 250, 255.11, 457, 487
See application file for complete search history.

(56) References Cited

U.S. PATENT DOCUMENTS

| | | | | |
|---|---|---|---|---|
| 4,341,841 A | * | 7/1982 | Ohno et al. .................. 428/414 |
| 4,343,533 A | * | 8/1982 | Currin et al. .................. 359/883 |
| 4,348,463 A | * | 9/1982 | Ohno et al. .................. 428/429 |
| 4,358,507 A | * | 11/1982 | Senaha et al. .................. 428/429 |
| 4,795,660 A | * | 1/1989 | Cooray et al. .................. 427/123 |
| 4,945,003 A | * | 7/1990 | Poole et al. .................... 428/462 |
| 5,091,483 A | * | 2/1992 | Mazurek et al. .............. 525/477 |
| 5,560,815 A | | 10/1996 | Sekimoto et al. |
| 5,626,972 A | | 5/1997 | Moysan, III et al. |
| 5,667,907 A | | 9/1997 | Audit et al. |
| 5,759,677 A | | 6/1998 | Fink |
| 5,814,415 A | | 9/1998 | Moysan, III et al. |
| 5,948,548 A | | 9/1999 | Welty et al. |
| 6,106,231 A | | 8/2000 | Brainch et al. |
| 6,168,242 B1 | * | 1/2001 | Mokerji ......................... 428/412 |
| 6,221,231 B1 | | 4/2001 | Foster |
| 6,245,435 B1 | | 6/2001 | O'Brien et al. |
| 6,277,494 B1 | * | 8/2001 | Mokerji ......................... 428/457 |
| 6,652,988 B2 | | 11/2003 | Katsamberis et al. |
| 6,733,887 B2 | * | 5/2004 | Okoroafor et al. ......... 428/423.3 |
| 2002/0170460 A1 | | 11/2002 | Goodrich |
| 2004/0038068 A1 | * | 2/2004 | Finch et al. ................... 428/626 |
| 2005/0101151 A1 | * | 5/2005 | Wada et al. .................. 438/745 |

FOREIGN PATENT DOCUMENTS

| | | |
|---|---|---|
| DE | 196 29 728 | 1/1998 |
| EP | 0 928 343 | 7/1999 |
| WO | WO 98/03694 | 1/1998 |

* cited by examiner

*Primary Examiner* — Kelly M Gambetta

(74) *Attorney, Agent, or Firm* — Katten Muchin Rosenman LLP

(57) ABSTRACT

The invention relates to a procedure for applying a coating with metallic or ceramic finish on the entirety or part of the surface of a thermoplastic, metallic or metallic alloy article, which comprises: preparing the thermoplastic, metallic, or metallic alloy article; applying on the article a base polymeric layer based on aqueous dispersions of resins without volatile organic components or on dispersions in organic solvents of resins without urethane; curing the base polymeric layer; and depositing a single layer of a metallic or ceramic material on the article coated with the cured base polymeric layer. The curing of the base polymeric layer is carried out at a temperature of between 30 and 80° C. in the case of thermal polymeric layers, or by means of ultraviolet radiation in the case of photosensitive polymeric layers. Optionally, a second transparent polymeric layer can be applied for protective purposes. This coating confers a metallic or ceramic appearance on the articles, as desired, as well as resistance to chemical corrosion and to external effects due to changes in weather and the mechanical friction produced in daily use.

7 Claims, No Drawings

PROCESS FOR APPLYING COATINGS WITH METALLIC CHROMIUM

This application claims priority to U.S. Provisional Application No. 60/700,551, filed on Jul. 19, 2005.

The present invention relates to a method for applying coatings with metallic or ceramic finish on thermoplastics, metallic and metallic alloy articles so that they have a decorative and protective layer.

BACKGROUND OF THE INVENTION

Coatings by means of electrolytic baths present many drawbacks at a technical and environmental level. The control systems required for the processes of electrolytic baths are very strict and the processes are very complex especially with non-conductive substrates.

In the case of chrome-plating, the chromium coatings by electrolytic baths are used as protective layers against corrosion and as a decorative finish. In general, these coatings are carried out in chemical baths formulated with hexavalent chromium, a compound classified as carcinogenic.

Recently, the industry has begun to evolve toward trivalent chromium as an acceptable alternative from the point of view of environmental protection. At the present time, this alternative has several limitations such as a) low resistance of the coating to corrosion, b) finishes of poor quality, and c) formation of hexavalent chromium during the process through anodic oxidation.

Moreover, in the conventional methods of coating by electrolytic baths, plastics are not conductive. Consequently, they must be subjected to complex processes of pre-treatment to be able to receive the technical coatings that confer the properties upon them. This preparation is complex and it contemplates the use of highly toxic and difficult to control products.

To obtain an article with a finish of electrolytic chromium, different layers must be applied to obtain the desired color and resistance to corrosion. For chromium deposition to obtain the desired color and gloss, it is necessary to apply onto the thermoplastic, metallic or a metallic alloy material successive layers of semi-gloss and gloss nickel. Also, depending on the articles treated, a layer should be applied to promote adhesion of the copper. The introduction of intermediate metallic layers increases the possibility of corrosion of the piece with the least defect in the final layer of chromium.

Furthermore, the use of electrolytic baths requires special equipment. The baths are very sensitive and require a separate control unit for each vat because each bath has different temperature, filtration, agitation and amperage characteristics.

Although improvements have been introduced in the process of trivalent chrome-plating with regard to color, appearance, process control, etc., it has not been possible to obtain a deposit with the same surface characteristics as obtained with the process of chrome-plating based on hexavalent chromium.

Electrodeposition with trivalent chromium is problematic because of low stability in the baths, resulting from the formation of hexavalent chromium through anodic oxidation. Additionally, trivalent chromium baths as proposed in U.S. Pat. No. 5,560,815 use an adapted electrode, thereby managing to substantially reduce the formation of hexavalent chromium. However, it has not been possible to completely eliminate this compound.

Another form of providing a finish of decorative metallic appearance, protective against corrosion comprises application of a coating by methods of physical vapor deposition (PVD) with prior application of electrolytic coatings which perform the function of masking substrate surface defects. The following patents describe application of a coating by a vapor phase method to articles previously coated by means of electrodeposition: U.S. Pat. No. 5,814,415; U.S. Pat. No. 5,667,904; U.S. Pat. No. 5,626,972; U.S. Pat. No. 5,948,548; U.S. Pat. No. 6,221,231; U.S. Pat. No. 6,106,958; U.S. Pat. No. 6,245,435; U.S. Pat. No. 5,759,677; EP 928343.

Another form of providing a metallic finish (chromium) (as in published U.S. Patent Application 2002/0170460), is to use an organic layer to smooth the surface of the layer on which a multilayer of Cr—Ni is applied to improve adhesion and subsequently, the final layer of chromium. The application of both layers, Cr—Ni and chromium, is carried out by PVD. Finally, an organic layer is applied to protect the PVD multilayer.

In this process, the use of electrolytic chromium is suppressed, but it requires the application of two organic layers; one to smooth the surface of the article and another one to protect the Cr—Ni/Cr multilayer against corrosion due to the presence of the nickel. The use of multilayer metallic coatings introducing nickel, increases susceptibility to corrosion of the articles, complicates the process of coating the different articles, and excludes arc PVD as the coating technique because of the magnetic properties of nickel.

On the other hand, there is the possibility of using a polymeric layer in substitution of the electrolytic metallic layers and deposition of the ensuing chromium coating by PVD. An example of this coating is described in U.S. Pat. No. 6,652,988, which refers to an article having a coating with decorative appearance, resistant to friction, wear and corrosion. The coating comprises a polymeric layer product of the reaction of an epoxy/urethane resin and polyamide or an epoxy/urethane resin in organic solvents, and a decorative coating formed by at least one layer obtained by vapor phase deposition. The layer comprises a chromium, a chromium compound, a refractory metal compound, or a refractory metallic alloy compound layer.

This coating avoids the need for application of electrolytic layers, but requires employment of urethane resins which contain isocyanates. Isocyanates are hazardous, presenting health risks during application, resulting from inhalation of isocyanate droplets which have not reacted. In addition to this serious drawback, this procedure is restricted by the type of substrate to be coated. The curing temperature of resins based on epoxy/urethane is relatively high, impeding its use on certain articles fabricated in materials of low melting point, particularly thermoplastics.

Thus, although diverse procedures are known in the state of the art to apply decorative and protective coatings on thermoplastics, metallic or metallic alloy articles, the need continues for alternative procedures which, as well as allowing a coating to be obtained with a metallic or ceramic finish resistant to chemical and mechanical corrosion, assure the absence in the process and in the coated article of compounds dangerous to health and which, in addition, allow working with a broader range of substrates without temperature restrictions. Examples of such dangerous compounds being isocyanates or, in the case of chromium coatings, hexavalent or trivalent chromium.

The coating procedure of the present invention, achieves coatings with metallic or ceramic finish avoiding the formation of isocyanates and allowing the coating of articles fabricated with materials of low melting point. Moreover, using photosensitive resins, UV curing, being instantaneous, allows shorter processes and, is therefore, more economical at the industrial level, thereby avoiding possible chemical attacks on the sensitive substrates.

Likewise, for coatings with a finish of electrolytic chromium, based on metallic chromium, metallic chromium is deposited without the formation of hexavalent chromium or trivalent chromium in the process.

SUMMARY OF THE INVENTION

It is an object of the present invention is to provide a method for applying a coating with a metallic or ceramic finish on the entirety or a part of thermoplastic, metallic or metallic alloy articles. The coating confers upon the articles a desired metallic or ceramic appearance, as well as resistance to chemical corrosion and to external wear and tear due to weather changes and mechanical friction occurring in daily use.

It is also as object of the present invention to provide a coating that reduces the risks of corrosion due to the absence of preliminary nickel layers and guarantees the absence, both in the coating and in the process of obtaining the coating, of isocyanates and hexavalent and trivalent chromium.

It is a further object of the present invention to provide a coating which can be applied on a broad range of thermoplastic, metallic or metallic alloy articles.

The coating process of the present invention comprises application of a base polymeric layer based on polymeric dispersions in water or organic solvents, curing, and subsequent single layer metallic or ceramic coating by means of physical vapor deposition (PVD) techniques.

Additional aspects of the invention provide for application of a second transparent polymeric layer based on polymeric dispersions in water or organic solvents, and curing.

The present invention discloses a process for producing a decorative layer, gloss or matt on thermoplastic, metallic and metallic alloy articles with improved surface properties, resistant to chemical corrosion and mechanical wear and tear.

It is yet another object of the present invention to provide a coating process which uses aqueous polymeric dispersions which are clean and environmentally friendly.

DETAILED DESCRIPTION OF THE INVENTION

The present invention provides a method for applying a coating with metallic or ceramic finish on the entirety or part of the surface of a thermoplastic, metallic or of metallic alloy article. The method comprises the steps of:
(a) preparing a thermoplastic, metallic, or metallic alloy article;
(b) applying on the article a base polymeric layer based on aqueous dispersions of resins without volatile organic components or in dispersions in organic solvents of resins without urethane;
(c) curing of the base polymeric layer, and
(d) depositing a single layer of a metallic or ceramic material on the article coated with the cured base polymeric layer;

Where the curing of the base polymeric layer of step (c) is carried out at a temperature of between 30 and 80° C. in the case of thermal polymeric layers, or by means of ultraviolet radiation in the case of photosensitive polymeric layers.

In one embodiment, the method of the invention additionally, comprises, the following steps:
(e) application of a second transparent polymeric layer on the single layer of metallic or ceramic material; and
(f) curing of the second transparent polymeric layer.

The application of this second transparent polymeric layer is made for protective purposes to enhance the resistance of the final piece to mechanical wear and tear (e.g. scratching) and to chemical corrosion (e.g. oxidation).

As used herein, the term "coating with metallic or ceramic finish" refers to a coating on an article or object whose surface has an attractive and aesthetic metallic or ceramic appearance, be it gloss or matt, which is maintained for duration of its useful life.

As used herein, the term "thermoplastic article" refers to an article fabricated of a thermoplastic polymeric material whose maximum working temperature, above, which the acceptable deformation is surpassed, is between 50 and 150° C. For example, the working maximum temperatures of some of the thermoplastic articles used in the invention are the following:

Acrylonitrile butadiene styrene (ABS)=85-100° C.
Polycarbonate (PC)=130-140° C.
Polypropylene (PP)=90-120° C.
Polyamide (PA)=80-140° C.
Polyvinyl chloride (PVC)=50-75° C.
Copolymers types ABS-PC=105-120° C.

These temperatures are approximate and depend on the method of obtaining the pertinent plastic.

In one embodiment of the procedure of the invention, the metallic material is a metal or a metallic alloy, preferably chromium, ruthenium, alloy of silver and rhodium or alloy of palladium and nickel.

In another embodiment, the ceramic material is a nitride or a carbonitride, preferably chromium nitride or zirconium carbonitride.

As used herein, the term "base polymeric layers" refers to a layer of resin with a high power for filling and leveling rough surfaces, as well as with a stable behavior at low pressure. This base layer acts as a primer layer improving the adhesion of the metallic layer, as well as the leveling function covering defects of polishing the substrate, a final aspect of the article being obtained with specular brilliance.

More particularly, the base layer is a polymeric layer based on aqueous dispersions of resins without volatile organic components (zero VOCs) or based on dispersions in organic solvents of resins without urethane. Both types of polymeric layers can be curable at temperatures which vary from 30° C. to 80° C., or by means of ultraviolet radiation for a time between 1 second and 10 minutes, depending on the substrate utilized as mentioned above.

The base polymeric layer acts as a leveling layer, covering the defects of polishing the substrate, its thickness being the minimum thickness necessary to perform the leveling function. Also, the polymeric layer acts as a promoter of the adhesion of the metallic layer and avoids possible processes of degassing of the substrate under vacuum conditions.

In one embodiment of the method of the invention, the thickness of the base polymeric layer applied on the entirety or part of the surface of the thermoplastic, metallic or metallic alloy article is between 1 and 20 microns, preferably between 5 and 15 microns.

In a preferred embodiment of the method of the invention, the curing of step (c) is carried out by means of drying at ambient temperature for a period of between 8 and 24 hours.

In another preferred embodiment of the method of the invention, the curing of step (c) is carried out by means of drying at ambient temperature during a period of time less than 15 minutes, and subsequently heating in an oven to a temperature of 50-70° C. for 20-95 minutes.

In yet another preferred embodiment of the method of the invention, the curing of step (c) is carried out by means of ultraviolet radiation during a period of less than 10 minutes.

In one embodiment of the method of the invention, step (d) of depositing a single layer of a metallic or ceramic material on the article previously coated with the cured polymeric layer comprises the following stages:
(i) exposing the article coated with the cured polymeric layer to vacuum conditions; and
(ii) depositing a single layer of metallic or ceramic material, by means of a vapor phase deposition technique on said article coated with the cured polymeric layer and exposed to vacuum conditions.

As used herein, the term "vapor phase deposition technique" refers to any known technique of vapor phase deposition, such as a technique of physical vapor deposition (PVD). The techniques are based on the formation of a vapor of the material to be deposited, the object being that the vapor condenses on the surface of the substrate forming a thin layer. Generally, the process should be carried out under vacuum conditions or in a controlled atmosphere with the object of avoiding the interaction of the vapor with the atmosphere of the air. PVD techniques are based on a solid material which is turned into vapor by means of thermal evaporation or evaporation by cathodic arc, or by ion bombardment (sputtering). The material in vapor form then condenses on the surface of the substrate in the form of a thin layer.

More specifically, the technique of PVD by cathodic arc consists of evaporating the material to be deposited by creating an electric arc on the surface of the target (i.e., the material to be evaporated). The material is evaporated in the form of ions which are deposited on the substrate. Also, the technique of PVD by sputtering (ion bombardment) consists of bombarding the surface of the target (the material to be deposited) with Argon ions, stripping off the atoms that collide with the Argon ions and the electrons, forming a plasma which is deposited on the substrate to be coated.

In one embodiment of the present invention, the vapor phase deposition technique is a technique of physical vapor deposition (PVD), preferably PVD by cathodic arc or PVD by sputtering at a temperature below the maximum working temperature of the substrate.

The curing of the base polmeric layer at temperatures between 30° C. and 80° C. or by means of ultraviolet radiation, depending on the substrate utilized, allows a broader range of substrates without temperature restrictions. Other substantial additional advantages of the curing are:
The curing allows the complete degassing of the base polymeric layer and of the substrate which allows a highly stable working vacuum inside the PVD coating chamber, very good adhesion of the PVD layer, and excellent resistance to moisture.
As pieces have a cured polymeric layer onto the PVD coating can be carried out at ambient temperature without needing to pre-heat the pieces. This allows shorter processes and, therefore, lower cost of the final articles.
The curing by means of ultraviolet radiation, a process carried out during a period of time of 1 second to 10 minutes, allows very short and very quick processes which result in very economical industrial processes. Furthermore, curing by UV, is a very quick process which therefore, allows very delicate samples to be treated avoiding the possible attack of the pieces with the product itself.
The aqueous polymeric dispersions employed in the preparation of the base polymeric layer are advantageously completely clean and environmentally friendly.

In another embodiment of the method of the present invention, step (a) of preparation of the article comprises the following steps:
(i) cleaning the article; and
(ii) drying the clean article.

More particularly, the cleaning is carried out by means of organic solvents to remove oxides and particles from the surface with minimum attack, preferably in ethanol baths in an ultrasonic washer during a period of time of between 5 and 20 minutes.

The articles to be coated are subjected to a process of cleaning by means of organic solvents, as described above. The base polymeric layer is subsequently applied on the articles by means of a process of conventional deposition, including but not limited, to immersion, spraying with a gun using automatic air-based systems, airless spraying, electro-cladding, and brushing. Following application of the polymeric layer, in the case of a thermally cured polymeric layer, the next step is evaporation of the diluting agent and curing of the resin at the appropriate temperature; between 30 and 80° C. In the case of a photosensitive polymeric layer, curing proceeds by means of ultraviolet radiation. Next, the articles coated with the cured polymeric layer are subject to vacuum conditions and a nanometric layer is deposited thereon of the desired metallic or ceramic material by means of a vapor phase deposition technique, as described above. Optionally, a second polymeric layer is applied by means of a process of conventional deposition such as immersion, spraying with a gun using automatic air-based systems, airless spraying, electro-cladding, brushing, etc. Once the second polymeric layer has been applied, in the case of a thermally cured polymeric layer, the next step is evaporation of the diluting agent and the curing of the resin at the appropriate temperature; between 30 and 80° C. In the case of a photosensitive polymeric layer, the curing proceeds by means of ultraviolet radiation.

In one embodiment of the method of the invention, the single layer of metallic or ceramic material obtained after step (d) has a thickness of between 10 and 600 nm, preferably between 10 and 300 nm.

In a preferred embodiment of the method of the invention, the single layer of ruthenium obtained after step (d) has a thickness of between 20 and 500 nm, preferably between 20 and 200 nm.

In another embodiment of the method of the invention, the coating obtained with electrolytic chromium finish does not contain hexavalent chromium nor trivalent chromium.

The metallic layer of chromium, ruthenium, silver-rhodium or zirconium carbonitride, for example, provide a decorative appearance to the article, as well as resistance to the chemical corrosion and mechanical aggression.

As described above, in some applications, after having applied the base polymeric layer and the PVD coating, a second transparent polymeric layer can be applied to increase the resistance of the final piece to both mechanical wear and tear and chemical attack or corrosion.

The second transparent polymeric layer is a polymeric layer based on aqueous dispersions of resins without volatile organic components (zero VOCs) or based on dispersions in organic solvents of resins without urethane. Both types of polymeric layers can be cured at a temperature which can vary from 30° C. up to 80° C., or by means of ultraviolet radiation for a period of time between 1 second and 10 minutes, depending on the substrate utilized as described above.

The thickness of this second polymeric layer applied on the entirety of the surface of the thermoplastic, metallic or metallic alloy article is between 1 and 20 microns, preferably between 5 and 15 microns.

In one embodiment of the method of the invention, the curing of this second transparent polymeric layer of step (f) is carried out by means of ultraviolet radiation for a period of time less than 10 minutes.

As has been mentioned above, the aqueous polymeric dispersions employed in the preparation of this second polymeric layer offer the advantage of being completely clean and environmentally friendly. Also, the curing by means of ultraviolet radiation, a process performed during a period of time of 1 second to 10 minutes, allows very short and very quick processes which result in very economical industrial processes.

In general, the coating of the present invention based on a metal or a metallic alloy applied on the aforementioned articles produces articles with a metallic appearance and specular brilliance.

Example 1

Method for Coating an Article of ABS with a Polymeric Layer and a Single Chromium Layer Initially, ABS pieces underwent cleaning in baths of a non-chlorinated organic solvent such as ethanol in ultrasonic washers.

Subsequently, on said previously treated ABS pieces, a polymeric layer was applied by means of spraying with a compressed air gun. Next, the resin was cured in an oven at a temperature of between 50 and 70° C. for 20-120 minutes.

Subsequently, a chromium single layer was deposited on the surface of the pieces coated with the cured polymeric layer by means of the technique of physical vapor deposition (PVD) by cathodic arc. For this, the pieces were subjected to a preliminary vacuum of $2.5 \times 10^{-5}$ mbar ($2.5 \times 10^{-3}$ Pa). Next, the layer was deposited by evaporating the cathodic material constituted by chromium. The working pressure was about $2.3 \times 10^{-3}$ mbar ($2.3 \times 10^{-1}$ Pa); the applied voltage to the targets during the deposition process was 60 A; the speed of rotation of the substrate remained constant during the coating process, the deposition time being less than 5 minutes. This way, a coating of chromium was obtained on the ABS pieces previously coated with the heat-hardened resin to a thickness of 10 and 300 nm.

To demonstrate the excellent adhesion of the coating obtained, as well as the excellent protection against chemical corrosion of the articles coated according to the procedure described above, tests were carried out according to the standard guide D6577-00a for testing industrial protective coatings. Tests for stress in the present example are the following:

A) Test of adhesion according to the standard ASTM D3359-02 with respect to measuring adhesion by adhesive tape.
  Following application of adhesive tape on the surface of the piece, microscopic inspection of the area of the piece subjected to the test was conducted. The layer appeared unaffected conserving a flat and glossy surface.
B) Test of resistance to salt spray in the fog chamber (ASTM B-117).
  After subjecting the coated pieces to a saline atmosphere containing 5% sodium chloride at a temperature of 35° C., they underwent a visual examination and, subsequently, the adhesion test. The layer appeared unaffected.
C) Test of resistance to water (ASTM D2247).
  In this test, the coated pieces were immersed in water at 38° C. Neither the chromium layer nor the polymeric layer were affected.

Example 2

Method of Coating an Article of ABS with a Polymeric Layer and a Single Ruthenium Layer Initially, the ABS pieces underwent cleaning in baths of a non-chlorinated organic solvent such as ethanol in ultrasonic washers.

Subsequently, on the previously treated ABS pieces, a polymeric layer was applied by means of spraying with a compressed air gun. Next, the resin was cured in an oven at a temperature of between 50 and 70° C. for 20-120 minutes.

Subsequently, a single ruthenium layer was deposited on the surface of the pieces coated with the cured polymeric layer by means of the technique of physical vapor deposition (PVD) by sputtering. For this, the pieces were subjected to a preliminary vacuum of $2.5 \times 10^{-5}$ mbar ($2.5 \times 10^{-3}$ Pa). Next, the layer was deposited stripping off the material from the ruthenium target. The working pressure was about $7 \times 10^{-3}$ mbar ($7 \times 10^{-1}$ PA). The bias voltage applied during the deposition process was 100 V. The speed of rotation of the substrate remained constant during the coating process, the deposition time being less than 5 minutes. The sputtering power was 0.8 kW. This way, a coating of ruthenium was obtained on the ABS pieces previously coated with the heat-hardened resin to a thickness of between 20 and 200 nm.

To demonstrate the excellent adhesion of the coating so obtained, as well as the excellent protection against chemical corrosion of the articles coated according to the procedure described above, tests were carried out accordingly to the standard guide D6577-00a for testing industrial protective coatings. Tests for stress in the present example are the following:

A) Test of adhesion according to the standard ASTM D3359-02 with respect to measuring adhesion by adhesive tape.
  This test consisted of the application of adhesive tape on the surface of the piece, with subsequent microscopic inspection of the area of the piece subjected to the test. The layer appeared unaffected conserving a flat and glossy surface.
B) Test of resistance to salt spray in the fog chamber (ASTM B-117).
  After subjecting the coated pieces to a saline atmosphere containing 5% sodium chloride at a temperature of 35° C., they underwent a visual examination and, subsequently, the adhesion test. The layer appeared unaffected.
C) Test of resistance to water (ASTM D2247).
  In this test, the coated pieces were immersed in water at 38° C. Neither the ruthenium layer nor the polymeric layer were affected.
D) Heat cycle test.
  The test consisted of exposing the coated piece to hot air up to 80° C. for 30 minutes and cooling it subsequently to ambient temperature. Next the piece was chilled with air down to −30° C. for 30 minutes, subsequently raising the temperature to the ambient temperature. The ruthenium layer, the polymeric layer, and the adhesion of both layers to the substrate of ABS were unaffected.

Example 3

Method for Coating an ABS Article with a Base Polymeric Layer, a Single Chromium Layer and a Protective Polymeric Layer Initially, the ABS pieces underwent cleaning in baths of a non-chlorinated organic solvent such as ethanol in ultrasonic washers.

Subsequently, on the previously treated ABS pieces, a polymeric layer was applied by means of spraying with a compressed air gun with a nozzle of 1 mm and pressure 2.5 atm. Next, the resin was cured with two UV lamps (120 W/cm$^2$) for 5 seconds.

Subsequently, a single chromium layer was deposited on the surface of the pieces coated with the cured polymeric layer by means of the technique of physical vapor deposition (PVD) by sputtering. For this, the pieces were subjected to a preliminary vacuum of $2.5 \times 10^{-5}$ mbar ($2.5 \times 10^{-3}$ Pa). Next, the layer was deposited stripping the material from the chromium target. The working pressure was about $7 \times 10^{-3}$ mbar ($7 \times 10^{-1}$ Pa). The bias voltage applied during the deposition process was 100 V; the speed of rotation of the substrate remained constant during the coating process, the deposition time being less than 5 minutes; the thickness between 20 and 200 nm.

Next, a polymeric layer was applied based on photosensitive oligomers of low viscosity, liquid concentrate with 100% solids and zero VOCs. The layer was cured with ultraviolet for less than 5 seconds.

To demonstrate the excellent adhesion of the coating obtained, as well as the excellent protection against chemical corrosion of the articles coated according to the procedure described above, tests were carried out according to the standard guide D6577-00a for testing industrial protective coatings. Tests for stress in the present example are the following:

A) Test of adhesion according to the standard ASTM D3359-02 with respect to measuring adhesion by adhesive tape.

This test consisted of the application of an adhesive tape on the surface of the piece, with subsequent microscopic inspection of the area of the piece subjected to the test. The layer appeared unaffected conserving a flat and glossy surface.

B) Test of resistance to salt spray in the fog chamber (ASTM B-117).

After subjecting the coated pieces to a saline atmosphere containing 5% sodium chloride at a temperature of 35° C., they underwent a visual examination and, subsequently, the adhesion test. The layer appeared unaffected.

C) Test of resistance to water (ASTM D2247).

In this test, the coated pieces were immersed in water at 38° C. Neither the chromium layer nor the polymeric layer were affected.

D) Heat Cycle test according to the standard PV1200:

The test consisted of 3 stages:

1.—Exposure of the coated piece to 100° C. for 6 hours. Checking the appearance and the adhesion according to ASTM D3359-02. The ASTM D3359-02 adhesion and appearance were unchanged.

2.—Raise the temperature of the piece from ambient temperature to 80° C. in a ramp of 2 hours; maintain the piece for 4 hours; reduce to −40° C. in a ramp of 2 hours; maintain the temperature for 4 hours; and again raise to ambient temperature. The results demonstrated that the physical appearance was maintained, and the adhesion according to ASTM D3359-02 remained unchanged.

3.—Maintain the piece at 90° C. for 500 hours. The results of the ASTM D3359-02 adhesion and the appearance were unchanged.

Although reference has been made to a specific embodiment of the invention, it is evident for an expert in the matter that the procedure described is susceptible to numerous variations and modifications, and that all the aforementioned details can be replaced by others technically equivalent, without surpassing the scope of protection defined by the claims attached.

The invention claimed is:

1. A method for applying a metallic chromium coating on an entirety or a part of a surface of a thermoplastic article, the method consisting essentially of the steps of:
   (a) cleaning and then drying the thermoplastic article;
   (b) applying a base polymeric layer on the article, the base polymeric layer being based on aqueous dispersions of resins without volatile organic components or dispersions in organic solvents of resins without urethane, or monomers or non-aqueous oligomers without volatile organic components, the base polymeric layer comprising a photosensitive layer;
   (c) curing at atmospheric pressure the base polymeric layer by ultraviolet radiation to form a cured base polymeric layer;
   (d) exposing the article coated with the cured base polymeric layer to a vacuum; and
   (e) depositing a single deposition layer of a metallic chromium on the article coated with the cured base polymeric layer by a vapor phase deposition technique while under vacuum to form the metallic chromium coating to create a finish on the part of the surface of the thermoplastic article;
   wherein no additional layers are deposited over the chromium layer;
   wherein at the conclusion of step (e) the metallic chromium coating has a corrosion resistance that passes the tests of ASTM D6577-00a.

2. The method according to claim 1, wherein the curing step (c) is performed by ultraviolet radiation for less than 10 minutes.

3. The method according to claim 1, wherein the vapor phase deposition technique comprises physical vapor deposition (PVD).

4. The method according to claim 3, wherein the vapor phase deposition technique is selected from the group consisting of PVD by cathodic arc and PVD by sputtering.

5. The method according to claim 1, wherein the cleaning is carried out by ethanol baths in an ultrasonic washer for a time of between 5 and 20 minutes.

6. The method according to claim 1, wherein the single deposition layer of step (e) comprises a thickness of between 10 and 600 nm.

7. The method according to claim 1, wherein the single deposition layer of step (e) comprises a thickness of between 10 and 300 nm.

* * * * *